(12) United States Patent
Iverson et al.

(10) Patent No.: US 11,328,873 B2
(45) Date of Patent: May 10, 2022

(54) PARALLEL PLATE CAPACITOR RESISTANCE MODELING AND EXTRACTION

(71) Applicant: Synopsys, Inc., Mountain View, CA (US)

(72) Inventors: Ralph Benhart Iverson, Arlington, MA (US); Xuerong Ji, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/139,185

(22) Filed: Dec. 31, 2020

(65) Prior Publication Data

US 2021/0202183 A1      Jul. 1, 2021

Related U.S. Application Data

(60) Provisional application No. 62/955,604, filed on Dec. 31, 2019.

(51) Int. Cl.
| | | |
|---|---|---|
| *G06F 30/30* | (2020.01) | |
| *H01G 4/40* | (2006.01) | |
| *H01G 4/248* | (2006.01) | |
| *G06F 30/398* | (2020.01) | |
| *G06F 30/367* | (2020.01) | |
| *G06F 30/39* | (2020.01) | |

(52) U.S. Cl.
CPC ............. *H01G 4/40* (2013.01); *G06F 30/367* (2020.01); *G06F 30/39* (2020.01); *G06F 30/398* (2020.01); *H01G 4/248* (2013.01)

(58) Field of Classification Search
CPC ........ H01G 4/40; H01G 4/248; G06F 30/367; G06F 30/39; G06F 30/398; H01L 28/40
USPC .......................................................... 716/111
See application file for complete search history.

(56) References Cited

U.S. PATENT DOCUMENTS

| | | | |
|---|---|---|---|
| 7,075,776 B1 * | 7/2006 | Devoe ..................... | H01G 4/40 361/309 |
| 7,197,446 B2 * | 3/2007 | Breiland ............... | G06F 30/367 703/14 |
| 7,269,810 B1 * | 9/2007 | Weller .................... | G06F 30/30 716/115 |

* cited by examiner

*Primary Examiner* — Jack Chiang
*Assistant Examiner* — Brandon Bowers
(74) *Attorney, Agent, or Firm* — Fenwick & West LLP (57) ABSTRACT

A parallel plate capacitor structure in an integrated circuit has a first plate and a second plate separated by an insulator, such as a dielectric. Both plates are connected to an interconnect structure at a plurality of connection points. The area of the first plate that overlaps with the second plate is identified. This overlap region does not include any connection points on the first plate. For this overlap region, the lumped element model for the first plate includes nodes on the edge of the overlap region (edge nodes), and lumped resistances between the edge nodes and the node connected to the lumped capacitance. In one embodiment, the lumped element model also includes a common node, all of the edge nodes are connected to the common node by lumped resistances, and the common node is connected by a negative resistance to the lumped capacitance.

20 Claims, 7 Drawing Sheets

PARALLEL PLATE CAPACITOR RESISTANCE MODELING AND EXTRACTION

CROSS REFERENCE TO RELATED APPLICATIONS

This application claims the benefit of U.S. Provisional Application No. 62/955,604, filed Dec. 31, 2019, which is incorporated by reference in its entirety.

TECHNICAL FIELD

The present disclosure relates to estimating resistance for parallel plate capacitor structures, such as MiM (Metal-insulator-Metal) capacitor structures, in integrated circuits.

BACKGROUND

Parasitic extraction accounts for parasitic effects in integrated circuits. The modeling of resistances in an integrated circuit is one aspect of parasitic extraction. An integrated circuit can include parallel-plate capacitors as elements. In some cases, the contacts to one of the plates is only around a perimeter area of the plate. A method to generate a resistance model for use with the lumped element representation of the capacitor may fail to account for the distributed nature of the capacitor plates.

SUMMARY

In one aspect, a method includes the following. A description of a parallel plate capacitor structure in an integrated circuit is accessed. The parallel plate capacitor structure has a first plate and a second plate. Each plate is connected to an interconnect structure at a plurality of connection points. Based on the description of the parallel plate capacitor structure, the overlap region between the two plates is identified. The overlap region of the two plates forms a parallel plate capacitor and the first plate has no connection points within the overlap region. A lumped element model for resistance of the overlap region of the first plate is determined by a processor. The lumped element model includes nodes on the edge of the overlap region (edge nodes), a capacitor node connected to a lumped capacitance of the parallel plate capacitor, and lumped resistances between the edge nodes and the capacitor node.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to parallel plate capacitor resistance modeling and extraction. Parasitic extraction accounts for parasitic effects in integrated circuits. The modeling of resistances is one aspect of parasitic extraction. Parallel plate capacitor structures are a type of device that may occur in integrated circuits. Their capacitance can be modeled by a lumped capacitance calculated from the geometry of the two plates in the parallel plate capacitor. However, the plates of the capacitor inherently have a distributed resistance rather than a lumped resistance and there currently is no consensus on what lumped resistances should be used in a lumped element model of the parallel plate capacitor structure. For example, in a grid-based analysis, the resistance from the perimeter of the plate to the center increases as the log of the density of grid points.

In one approach described herein, the distributed resistance for a plate of the capacitor is modeled using lumped elements, rather than distributed elements such as the distributed resistance of the capacitor plate. The lumped element model is a circuit schematic that uses nodes that represent the edge of an overlap area between the two plates, where there are no connections to an interconnect structure. The model also includes a capacitor that represents the parallel plate capacitor, and resistors between the edge nodes and the capacitor. For clarity, these resistors used in the circuit schematic may be referred to as lumped resistances or lumped resistors, to distinguish them from the distributed resistance of the capacitor plate. In one approach, the lumped resistances are calculated to preserve the point-to-point one-dimensional resistance when current flows only in one dimension. As a result, the point-to-point resistance across the capacitor plate in the x direction and in the y direction as calculated according to the lumped element model are the same as the point-to-point resistances calculated using models based on the distributed resistance of the capacitor plates. The lumped element model may also preserve values for average timing and/or power dissipation.

Figure 1A:
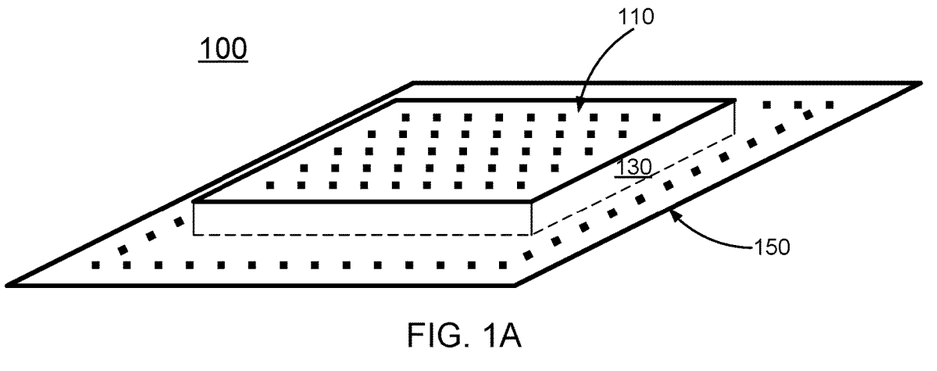
FIG. 1A depicts a perspective view of a parallel plate capacitor structure in an integrated circuit.

FIG. 1A depicts a perspective view of a parallel plate capacitor structure 100 in an integrated circuit. The following examples use a MiM (Metal-insulator-Metal) capacitor, but the present disclosure also applies to other types of parallel plate capacitors. The parallel-plate MiM structure includes a top plate 110, a bottom plate 150 and an insulator 130 between the two plates. For example, the top plate 110 may be implemented in one metal layer, and the bottom plate 150 in a different metal layer. In this example, the top plate 110 is smaller than the bottom plate 150. The top plate 110 is connected to an interconnect structure through a dense array of vias that contact the top plate 110 at the connection points indicated by black squares in FIG. 1. The interconnect structure typically are metal layers of the integrated circuit, which are not shown in FIG. 1. The bottom plate 150 is connected to the interconnect structure along the plate's perimeter, also through an array of vias that contact the plate at the connection points indicated by black squares. The interior portion of the bottom plate 150 that is below the top plate 110 does not have vias. Connections to the bottom plate 150 occur only where there is no overlap with the top plate 110.

Figure 1B:
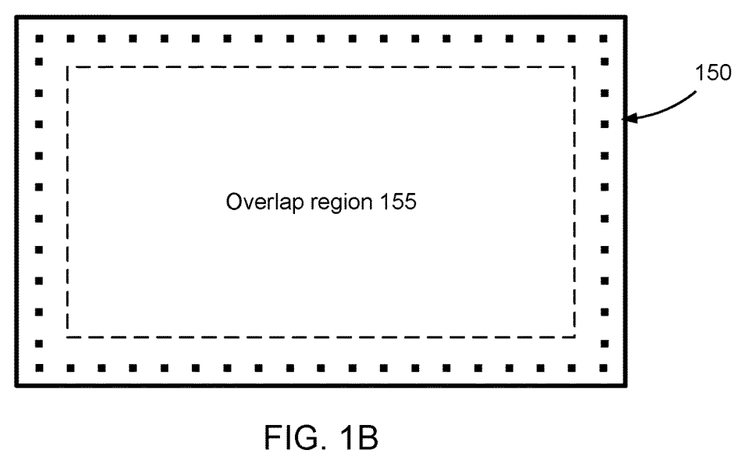
FIG. 1B depicts the bottom plate of the parallel plate capacitor structure.
Figure 1C:
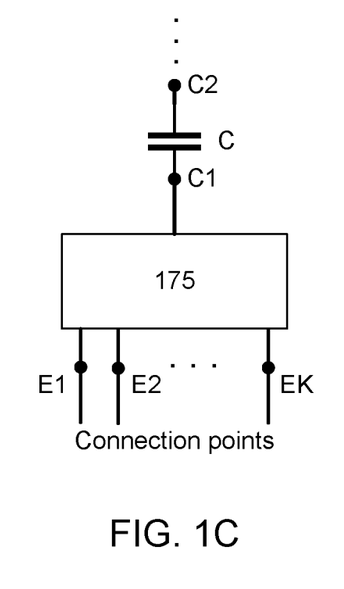
FIG. 1C depicts a lumped element model of the parallel plate capacitor structure.

FIG. 1B depicts the bottom plate of the parallel plate capacitor structure, and FIG. 1C depicts a lumped element model of the parallel plate capacitor structure. In FIG. 1B, the dashed line identifies an overlap region 155 where the top plate 110 and the bottom plate 150 overlap. This overlap region 155 forms the parallel plate capacitor. On the bottom plate 150, the overlap region 155 excludes the perimeter area with the connection points and there are no connection points within this overlap region.

In FIG. 1C, the capacitance of this structure is modeled as a lumped capacitance C between two nodes labelled C1 and C2, which will be referred to as the capacitor nodes. The lumped capacitance C is the capacitance of the parallel plate capacitor structure. The bottom plate 150 also presents a sheet resistance because all the connection points are outside the overlap region 155. Thus, FIG. 1C also includes a lumped element model 175 for the resistance of this overlap region of the bottom plate 150. In the lumped element model, the overlap region is represented by "edge nodes" Ek. These are nodes that represent the edges of the overlap region 155. The lumped element model 175 includes lumped resistances between the edge nodes Ek and the capacitor node C1. If the connection points are all connected in parallel, then the edge nodes Ek may be collapsed into a single node and the individual lumped resistances aggregated into a single parallel resistance, which will be referred to as $R_\|$. For clarity, modeling of the top plate 110 is omitted in FIG. 1C. If the array of connection points on the top late is dense enough, there may be no need for a separate resistance model of the top plate. Alternatively, the approach described for the bottom plate may also be used for the top plate.

The above concepts are described in more detail using the example shown in FIG. 1. However, other variations are possible. For example, the top plate might be the larger of the two with connections to the perimeter (from the bottom). Alternatively, there could be a three-plate structure where the top and bottom plates are connected together, and the middle plate has contacts only along the perimeter. Alternatively, both the top plate and the bottom plate may have contacts only along the perimeter. The contacts do not have to extend around the entire perimeter. They may exist only on one edge or only along a portion(s) of the perimeter. The plates also do not have to be rectangular in shape.

Figure 2:
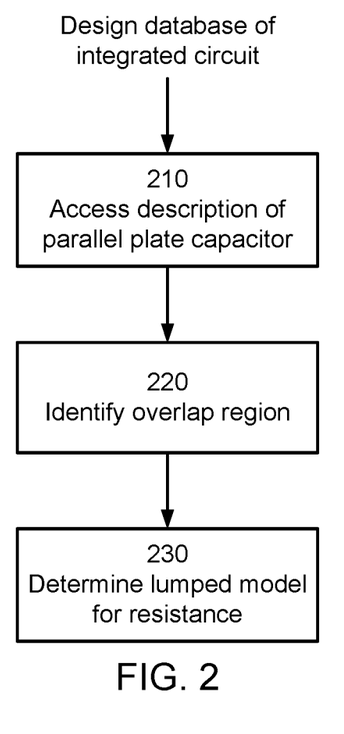
FIG. 2 depicts a flowchart of a process for determining a lumped element model for the resistance of a parallel plate capacitor structure in accordance with some embodiments of the present disclosure.

FIG. 2 depicts a flowchart of a process for determining a lumped element model for the resistance of a parallel plate capacitor structure in accordance with some embodiments of the present disclosure. A computer system accesses a description of a parallel plate capacitor structure in an integrated circuit at 210. The parallel plate capacitor structure includes a first plate and a second plate. Both plates are connected to an interconnect structure at a plurality of connection points. The description of the parallel plate capacitor structure includes the size and relative location of the parallel plates. The computer system identifies an overlap region of the first plate (e.g., overlap region 155 for bottom plate 150 of FIG. 1B) at 220. The overlap region forms a parallel plate capacitor with the second plate, but the connection points to the first plate are all located outside the overlap region. The computer system determines a lumped element model for the resistance of the overlap region for the first plate at 230. The lumped element model uses edge nodes of the overlap region (e.g., nodes Ek in FIG. 1C), a capacitor node for a lumped capacitance of the parallel plate capacitor (e.g., node C1 in FIG. 1C), and lumped resistances between the edge nodes and the capacitor node.

Figure 3A:
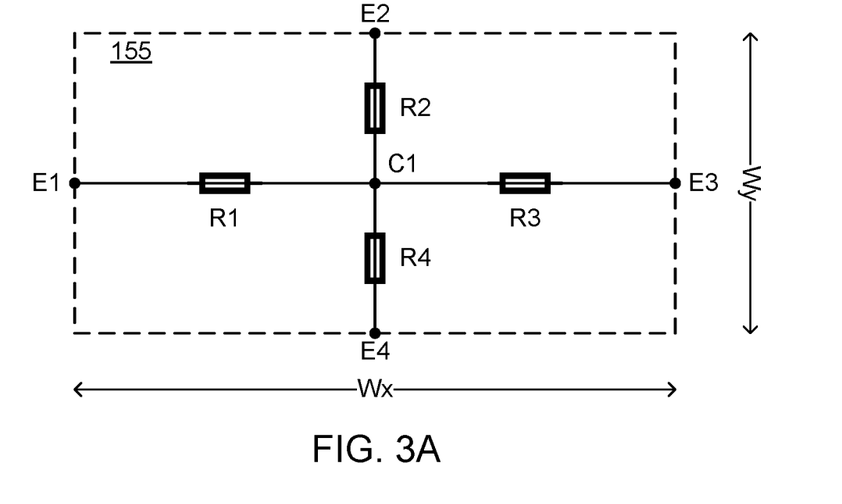
FIG. 3A depicts an Rg/2 lumped element model using one node per edge.

FIG. 3A depicts an Rg/2 lumped element model using one node per edge: nodes E1-E4. Rg stands for "gate resistance." Two common gate-resistance models for transistors are Rg/2 and Rg/3. The Rg/2 and Rg/3 lumped element models described herein apply the sense of these models to the parallel plate capacitor. For metal oxide semiconductor (MOS) transistors which have a gate terminal, Rg/2 and Rg/3 are effectively one-dimensional models, where the electrical current charges the device capacitance by flowing in the primary direction of the one-dimensional model. Applied to a two-dimensional rectangular capacitor, as described here, the electrical current charges the capacitor by traveling in both x and y directions (i.e., in two dimensions), consistent with the physical configuration of the capacitor.

In FIG. 3A, the lumped element model is superimposed on the overlap region 155 for purposes of explanation. In this model, each edge is modeled as a single voltage. Each node Ek is connected to the capacitor node C1 by the corresponding lumped resistance Rk. In FIG. 3, the overlap region 155 is $W_X \times W_Y$ in size and has a sheet resistance $R_{SHEET}$. An Rg/2 model preserves the point-to-point one-dimensional resistance when current flows only in the x direction, or only in the y direction. Consistent with standard interconnect modeling, the point-to-point resistance values (P2P) from one edge to the opposite edge should match the solution when current flow is only in x or y. Applying this constraint yields:

$$R1=R3=R_{SHEET}*(W_X/2W_Y) \quad (1A)$$

$$R2=R4=R_{SHEET}*(W_Y/2W_X) \quad (1B)$$

$$R_\|=R_{SHEET}*W_XW_Y/[4(W_X*W_X+W_Y*W_Y)] \quad (1C)$$

where $R_\|$ is the parallel resistance from all edges (four resistors in parallel) to the capacitor node C1.

Figure 3B:
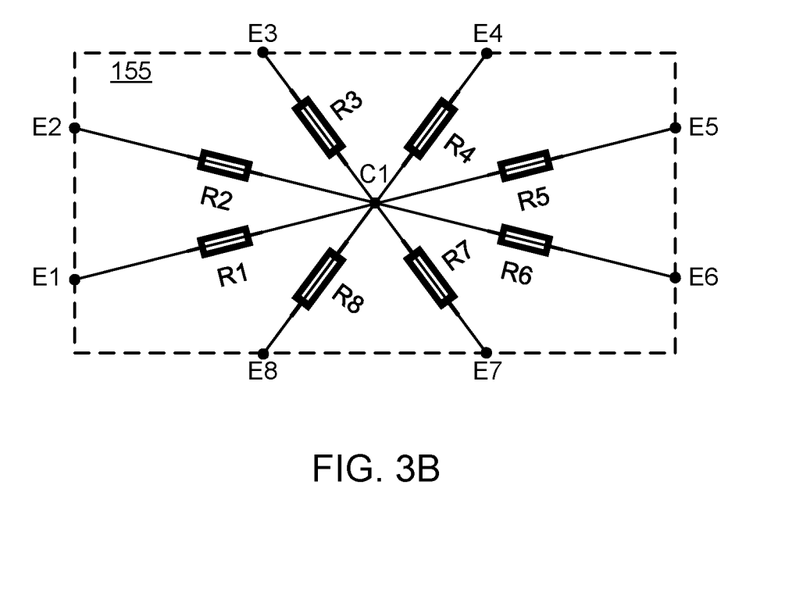
FIG. 3B depicts an Rg/2 lumped element model using multiple nodes per edge.

When an edge is not modeled as a single voltage, one approach is to replace the single node and resistor per edge with multiple nodes and resistors for different parts of the edge. FIG. 3B depicts an Rg/2 lumped element model using two nodes per edge, nodes E1-E8, and corresponding lumped resistances R1-R8. Applying the constraint described above for one-dimensional current flow yields:

$$R1=R2=R5=R6=R_{SHEET}*(W_X/W_Y) \quad (2A)$$

$$R3=R4=R7=R8=R_{SHEET}*(W_Y/W_X) \quad (2B)$$

$$R_\|=R_{SHEET}*W_XW_Y/[4(W_X*W_X+W_Y*W_Y)] \quad (2C)$$

Other variations will be apparent. For example, using one node per edge effectively models the vias along that edge as all at the same voltage (i.e., all shorted together). If that is not the case, adding more nodes per edge may yield a more accurate model. For example, the number of edge nodes along each edge of the overlap region may depend on the number or spacing of connection points within the perimeter area adjacent to that edge. As another example, if an edge contains a single via, it can be modeled as a partial connection along that edge.

Figure 3C:
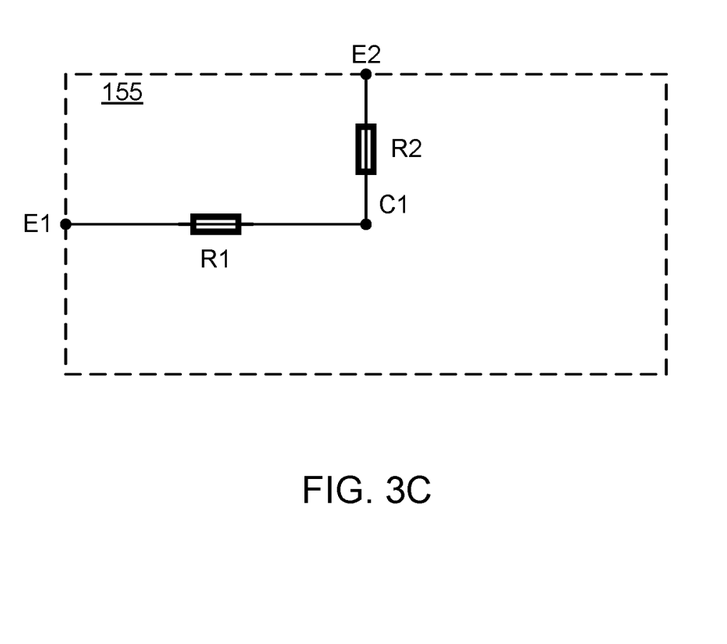
FIG. 3C depicts an Rg/2 lumped element model with connection points along two edges.
Figure 3D:
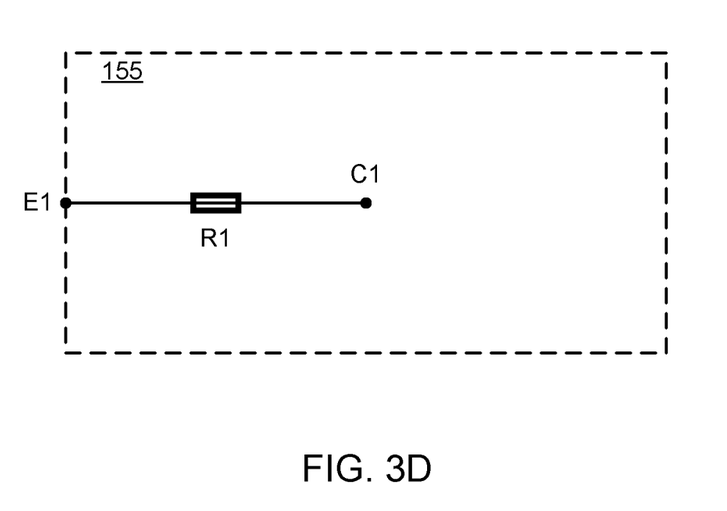
FIG. 3D depicts an Rg/2 lumped element model with connection points along one edge.

FIGS. 3C and 3D depict Rg/2 lumped element models where connection points are located only along two edges or along one edge, respectively. In these examples, the edges with connection points or modeled using a single node, as in FIG. 3A. The values of the lumped resistances R1 and R2 are given by Eqns. 1A-1B above.

Figure 4:
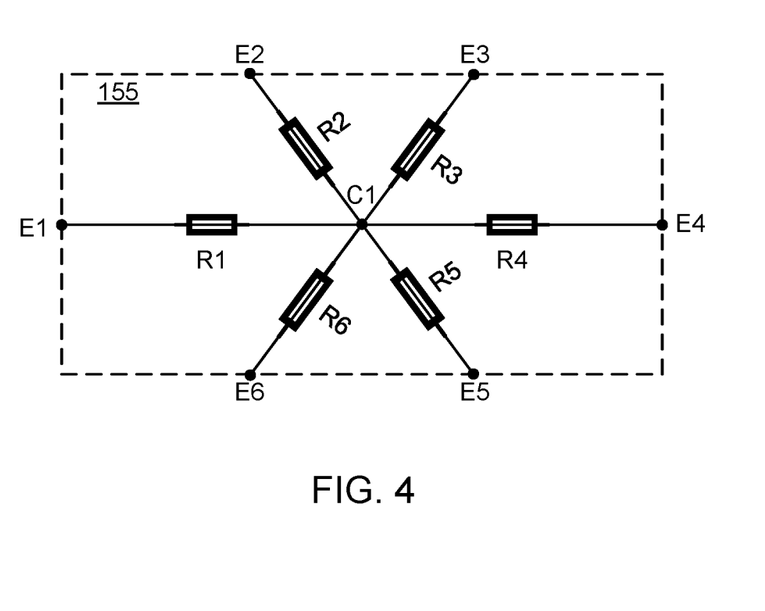
FIG. 4 depicts another embodiment of a lumped element model using an a different number of nodes per edge.

FIG. 4 depicts another embodiment of a lumped element model using a different number of nodes per edge. In this example, there are six edge nodes E1-E6 with corresponding lumped resistances R1-R6.

The resistances are selected such that the resistance between any two nodes, as predicted by the lumped element model, is the same as the actual resistance calculated using a distributed resistance model of the overlap region 155. This approach may be generalized to any number of nodes per edge. For example, different numbers of nodes along an edge may be used because that may yield a more accurate model. The distribution of connection points may also lead to different node locations. If the connection points are organized into dense groups (e.g., such that all connection points in a group may be considered to be at the same voltage), there may be one node per group. In one approach, the lumped resistances is calculated as follows. Assume that an edge of length L is modeled by Ej nodes, j=1 to J, each of which accounts for a length Lj along the edge and each of which has a corresponding resistance Rj to the capacitor node C1. Assume that the total resistance to that edge is given by R. The total resistance R is the resistance given by Eqn. 1 above, assuming only a single node along the edge. Then, each resistance Rj may be calculated as:

$$Rj=R*(L/Lj). \tag{3}$$

In this way, the total resistance of the J resistances Rj in parallel is equal to R. Other approaches may also be used.

Figure 5:
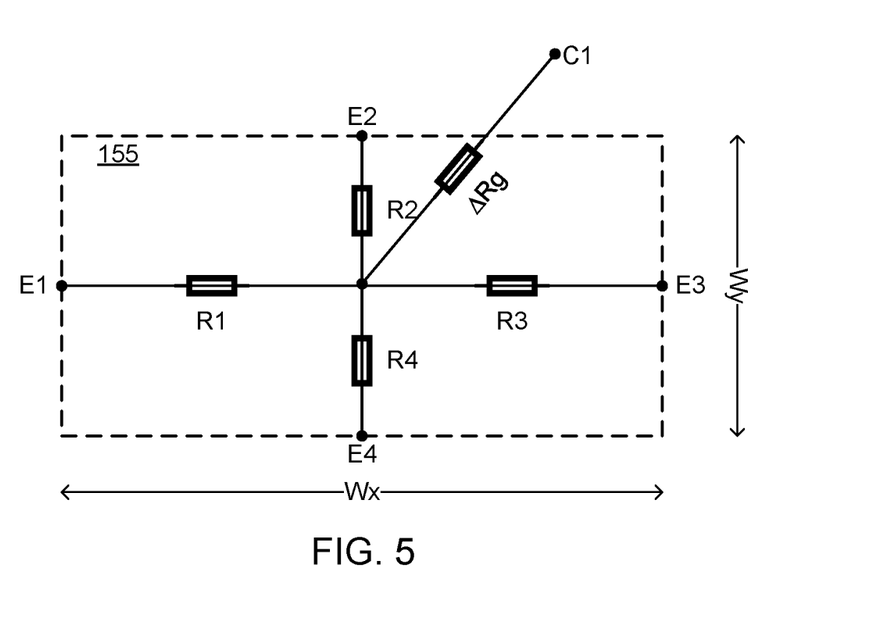
FIG. 5 depicts an Rg/3 lumped element model.

FIG. 5 depicts an Rg/3 lumped element model. The Rg/3 model preserves the point-to-point one-dimensional resistance values, as in the Rg/2 model. The Rg/3 model also gives correct values for average timing and power dissipation for nodes on the bottom plate. In FIG. 5, the Rg/3 model is created by inserting a negative lumped resistance (the ΔRg resistor in FIG. 5) between the common node of the Rg/2 model and the capacitor node C1 of the MiM device. This approach preserves the Rg/2 edge-to-edge resistances. An approximate value for this resistance is given by $(-\frac{2}{3})R_{\parallel}$. A more accurate value may be found by calculating the Elmore delay time (i.e., first order approximation of the RC delay time) to points within the capacitor and finding the resistance value required to give the average delay time in a lumped element model.

The following Table 1 shows the calculated value for various aspect ratios ($W_X/W_Y$) of a rectangular overlap region. The column "ΔRg coef" in Table 1 shows the factor to use as a function of the aspect ratio $W_X/W_Y$, in place of $-\frac{2}{3}$. That is, $\Delta Rg=(coef)R_{\parallel}$. In Table 1, R is the resistance from the entire perimeter of the overlap region to the center, calculated using a distributed model. $R_{\parallel}$ (using Rg/2) is the parallel resistance calculated using the Rg/2 approach described above, for example using Eqns. 1C or 2C. Both resistances R and $R_{\parallel}$ are normalized to allow for direct comparison. "ΔRg coef" is the correction factor applied to the $R_{\parallel}$ resistance to yield the R resistance. That is, $R=R_{\parallel}+(coef)R_{\parallel}$. As a result, the resistance between the edge nodes and the capacitor node, as determined by the lumped element model, is the same as the resistance between the perimeter of the overlap region and the center of the overlap region, as determined based by a distributed resistance model of the overlap region.

TABLE 1

ΔRg coef as a function of aspect ratio

| Wx/Wy | R | $R_{\parallel}$ (using Rg/2) | ΔRg coef |
|---|---|---|---|
| 0.1 | 0.0078 | 0.0248 | −68.5% |
| 0.2 | 0.0146 | 0.0481 | −69.7% |
| 0.3 | 0.0203 | 0.0688 | −70.5% |
| 0.4 | 0.0249 | 0.0862 | −71.1% |
| 0.5 | 0.0286 | 0.1000 | −71.4% |
| 0.6 | 0.0313 | 0.1103 | −71.6% |
| 0.7 | 0.0332 | 0.1174 | −71.8% |
| 0.8 | 0.0344 | 0.1220 | −71.8% |
| 0.9 | 0.0350 | 0.1243 | −71.9% |
| 1.0 | 0.0351 | 0.1250 | −71.9% |

Figure 6:
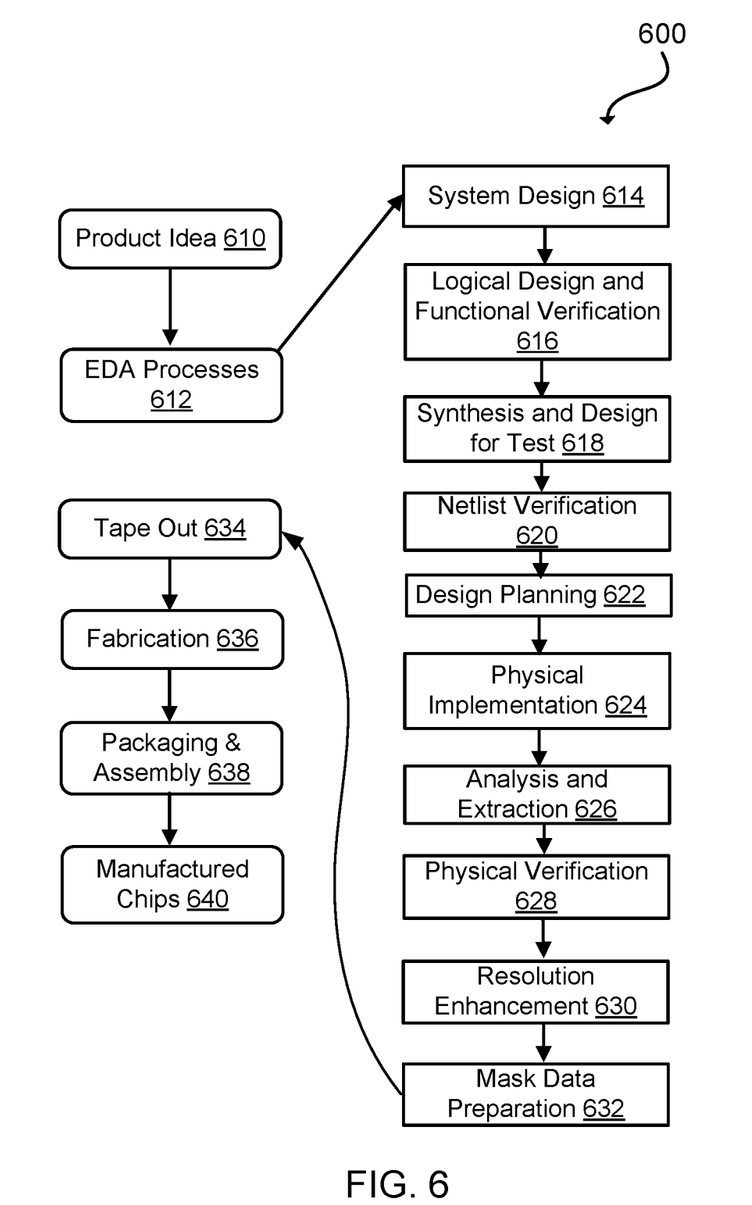
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
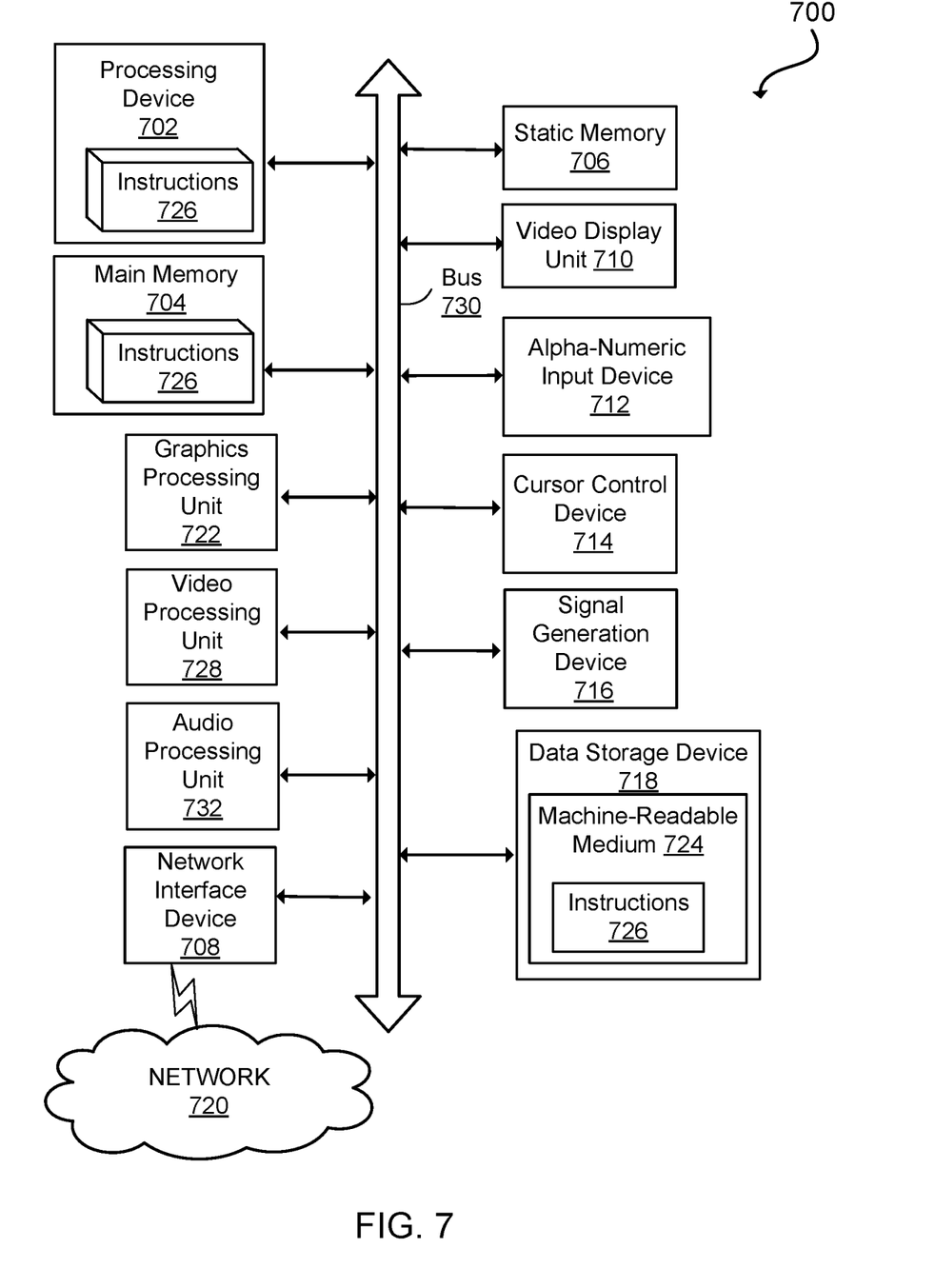
FIG. 7 depicts an abstract diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   accessing a description of a parallel plate capacitor structure in an integrated circuit, the parallel plate capacitor structure comprising a first plate and a second plate, wherein each plate is connected to an interconnect structure at a plurality of connection points;
   based on the description of the parallel plate capacitor structure:
   identifying an overlap region of the two plates, wherein the overlap region of the two plates forms a parallel plate capacitor and the first plate has no connection points within the overlap region; and
   determining, by a processor, a lumped element model for resistance of the overlap region of the first plate, the lumped element model comprising edge nodes of the overlap region, a capacitor node connected to a lumped capacitance of the parallel plate capacitor, and lumped resistances between the edge nodes and the capacitor node.

2. The method of claim 1 wherein the overlap region is rectangular, and the lumped element model preserves resistance values when current flows from one edge to an opposite edge.

3. The method of claim 1 wherein the lumped element model preserves average timing values for the overlap region.

4. The method of claim 1 wherein the lumped resistances between the edge nodes and the capacitor node are based on a sheet resistance of the overlap region and a geometry of the overlap region.

5. The method of claim 1 wherein, in the lumped element model, all of the edge nodes are connected to a common node by lumped resistances.

6. The method of claim 5 wherein a number of edge nodes along each edge of the overlap region depends on a number of connection points within the perimeter area adjacent to that edge.

7. The method of claim 5 wherein a resistance between the edge nodes and the capacitor node, as determined by the lumped element model, is the same as a resistance between a perimeter of the overlap region and a center of the overlap region as determined based on a distributed resistance model of the overlap region.

8. The method of claim 5 wherein, in the lumped element model, the capacitor node is connected to the common node by a negative lumped resistance.

9. The method of claim 8 wherein the negative lumped resistance is determined based on Elmore delay.

10. The method of claim 8 wherein the negative lumped resistance is determined based on an aspect ratio of the overlap region.

11. The method of claim 1 further comprising:
using the lumped element model in parasitic extraction as part of a design process for the integrated circuit.

12. A system comprising:
a memory storing instructions; and
a processor, coupled with the memory and to execute the instructions, the instructions when executed cause the processor to:
   access a description of a parallel plate capacitor structure in an integrated circuit, the parallel plate capacitor structure comprising a first plate and a second plate, wherein each plate is connected to an interconnect structure at a plurality of connection points;
   identify an overlap region of the two plates, wherein the overlap region of the two plates forms a parallel plate capacitor and the first plate has no connection points within the overlap region; and
   determining, by a processor, a lumped element model for resistance of the overlap region of the first plate, the lumped element model comprising edge nodes of the overlap region, a capacitor node for a lumped capacitance of the parallel plate capacitor, and lumped resistances between the edge nodes and the capacitor node.

13. The system of claim 12 wherein the second plate is connected to the interconnect structure at an array of connection points distributed across the overlap region of the second plate.

14. The system of claim 12 wherein the connection points for the first plate are located within a perimeter area of the first plate, and the first plate is connected to the interconnect structure by vias that connect to the plurality of connection points.

15. The system of claim 12 wherein the first plate comprises one metal layer in the integrated circuit, and the second plate comprises a different metal layer in the integrated circuit.

16. The system of claim 12 wherein, in the lumped element model, all of the edge nodes are connected to a common node by lumped resistances.

17. A non-transitory computer readable medium comprising stored instructions, which when executed by a processor, cause the processor to:
   access a description of a parallel plate capacitor structure in an integrated circuit, the parallel plate capacitor structure comprising a first plate and a second plate, wherein each plate is connected to an interconnect structure at a plurality of connection points;
   identify an overlap region of the two plates, wherein the overlap region of the two plates forms a parallel plate capacitor and the first plate has no connection points within the overlap region; and
   determining, by a processor, a lumped element model for resistance of the overlap region of the first plate, the lumped element model comprising edge nodes of the overlap region, a capacitor node for a lumped capacitance of the parallel plate capacitor, and lumped resistances between the edge nodes and the capacitor node.

18. The computer readable medium of claim 17 wherein the lumped element model comprises an Rg/3 lumped element model for the overlap region.

19. The computer readable medium of claim 17 wherein, in the lumped element model, all of the edge nodes are connected to a common node by lumped resistances.

20. The computer readable medium of claim 19 wherein, in the lumped element model, the capacitor node is connected to the common node by a negative lumped resistance.

* * * * *